(12) United States Patent
Masters et al.

(10) Patent No.: US 6,307,162 B1
(45) Date of Patent: *Oct. 23, 2001

(54) INTEGRATED CIRCUIT WIRING

(75) Inventors: Mark E. Masters, Essex Junction; David P. Vallett, Fairfax, both of VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/761,515

(22) Filed: Dec. 9, 1996

(51) Int. Cl.[7] ............................................ H01R 9/16
(52) U.S. Cl. ...................... 174/262; 174/261; 174/255; 361/803
(58) Field of Search ................... 174/250, 254, 174/260, 262, 261, 255; 257/529, 530; 361/777, 792, 803, 805

(56) References Cited

U.S. PATENT DOCUMENTS

| | | | | |
|---|---|---|---|---|
| 2,758,256 | * | 8/1956 | Eisler | 174/254 X |
| 3,356,786 | * | 12/1967 | Helms | 361/805 X |
| 3,766,308 | | 10/1973 | Loro | 174/254 |
| 4,458,297 | * | 7/1984 | Stopper et al. | 361/805 X |
| 4,710,592 | | 12/1987 | Kimbara | 174/262 |
| 4,764,644 | * | 8/1988 | Reisman et al. | 174/254 X |
| 4,825,276 | | 4/1989 | Kobayashi | 257/207 |
| 4,974,048 | * | 11/1990 | Chakravorty et al. | |
| 5,060,116 | | 10/1991 | Grobman et al. | 361/792 |
| 5,155,577 | | 10/1992 | Chance et al. | 257/773 |
| 5,214,250 | | 5/1993 | Cayson et al. | 174/250 |
| 5,243,140 | | 9/1993 | Bhatia et al. | 174/254 |
| 5,508,938 | | 4/1996 | Wheeler | 364/488 |
| 5,572,409 | * | 11/1996 | Nathan et al. | 174/261 |

OTHER PUBLICATIONS

Tsui, "Engineering change wiring modifications in Josephson Technology" IBM Technical Disclosure Bulletin, vol. 24, No. 4 Sep. 1981, pp 1987–1990.*

Wahler, "Using fusible links to apply machine–readable Serial Numbers to printed circuit boards", IBM Technical Disclosure Bulletin, vol. 20, No. 6, Nov. 1977, p2286.*

Proceedings of the 20th International Symposium for Testing and Failure Analysis, Nov. 13–18, 1994 Authors: Lee et al., Title: Design Guidelines for FIB Modifiability and a Case Study of a High Performance SCSI Chip with Timing Problems.

* cited by examiner

*Primary Examiner*—Albert W. Paladini
(74) *Attorney, Agent, or Firm*—Robert A. Walsh

(57) ABSTRACT

An integrated distribution wiring system for a semiconductor substrate having a number of devices. The distribution system includes additional stripes which are arranged parallel to existing rails carrying power or signals to the devices. These stripes being separable from the rails may be used to make engineering changes such as repairs or modifications of the circuits in the devices or characterizing or diagnosing the devices.

8 Claims, 4 Drawing Sheets

INTEGRATED CIRCUIT WIRING

BACKGROUND OF THE INVENTION

1. Field of the Invention

The present invention generally relates to wiring systems for integrated circuits (IC) and, more particularly, to wiring systems which facilitate engineering changes for the following functions: electrical characterization; diagnostic testing; and circuit modifications for repair or evaluation. These functions may hereinafter be collectively referred to as Engineering Changes or EC's.

2. Description of the Prior Art

The formation of integrated circuit chips in accordance with different technologies has been known for a number of years. A demand for increased complexity of electronic systems including such integrated circuits has caused the development of techniques for wiring modification and repair of such IC chips.

The IC multi-layer construction is similar to multi-layer circuit boards in that wiring can be run in a direction parallel to the surface at the interface between any two dielectric layers. Wiring can be run perpendicular to the surface and between wiring layers with through-holes or "vias" in the layers which are selectively filled with conductive materials. Multi-layer wiring and modules have been implemented with a variety of technologies including multi-layered co-fired ceramics, silicon based thin film structures, ceramic based thin film structures and combinations of those techniques.

However, because of the multi-layer construction, there is no ready access to wiring other than on the surface of the multi-layer structure. Therefore, engineering changes cannot readily be made.

Perhaps of equal importance is the fact that while electronic modules are large relative to the chips they contain, they are often very complex and of fairly small overall dimensions. Therefore, they are subject to connector or conductor defects in the same manner as the chips to be mounted thereon and so manufacturing yields of the multi-layer structure must also be considered. The length of the conductors is quite substantial because complex wiring metallization must be provided to allow each output terminal of one chip to be connected to a plurality of other input terminals on other chips. Additionally, so-called fanout wiring is often provided to interface between the fine wiring patterns characteristic of the connector spacing of the chips and the relatively more coarse wiring patterns on multi-chip modules (MCM). The problem of circuit defects is aggravated by the manufacturing processes used to create the multi-layer structures, which are difficult to characterize, diagnose, or effect repairs.

Since such structures are complex and require a number of processing steps for each layer, substantial expense is involved in fabrication of the multi-layer structure. It is therefore economically important that the multi-layer module be repairable. It is similarly important that diagnostics are conducted, design changes are possible, or circuit repairs are possible on IC's to ensure corrective masks used in the IC fabrication are effective. In the past, this has been accomplished on modules by a process known as ECing or the implementing of engineering changes, which required providing one or more layers of redistribution wiring from the I/O pads to EC pads on the top surface. However, these layers of redistribution wiring are also subject to the same potential defects as other wiring layers and are not repairable. Further, such patterns of redistribution wiring are in close proximity to each other, requiring high line (e.g., wiring patterns) quality, and, parasitic capacitance will exist causing signal delays, reduced noise margins and other effects, thereby posing a severe restriction on wiring design rules. Additionally, in order to facilitate engineering changes for the following functions: electrical characterization; diagnostic testing; and circuit modifications for repair or evaluation, a significant amount of product and process complexity is required. This function also traditionally requires additional area for the redistribution wiring and EC pads, thus limiting the maximum possible density of the wiring.

Within the individual IC chip, the complexity of the problem is further complicated because electrical access to internal circuit nodes must be accomplished on an extremely small scale. However, such access to an integrated circuit is often necessary in order to characterize the electrical behavior of the node, electrically stimulate the node, or to establish continuity between the node and some other circuit node or access point for EC purposes. These exercises are done in failure analysis, characterization, and design debug environments to address business needs.

The need to electrically establish continuity between the node of interest and a pad, test point, or circuit node that is substantially distant is increasing. This is often driven by the need to bring out a node of interest to a location where it is not obstructed by the packaging, probe equipment, or other chip surface features for characterization purposes. Additionally, the rerouting of circuit nets for engineering changes may require substantial lengths of wiring between nodes to be linked.

The EC's of internal circuit nodes for initial design verification/debug or failure analysis has been addressed in the past by opening an access point to the circuit node of interest with blanket delayering, localized delayering or focused-ion-beam (FIB) milling techniques, the optional depositions of a conductive pad or line using FIB, laser chemical vapor deposition (LCVD), or conventional IC processing techniques, and possibly followed with the probing of the exposed node or deposited pad using contact probing or electron-beam probing approaches.

An early approach to electrically access internal nodes involved using lithography techniques in a laboratory setting to pattern a mask used to define regions where holes would be etched down to the circuit nodes of interest. Subsequent to this preparation of the chip, mechanical probes were used to make contact to the exposed circuit nodes. In time, electron-beam probes were used for the interrogation or stimulation of these nodes; e.g., voltage contrast and electron beam induced current techniques. This approach worked well for devices patterned with up to two levels of wiring and where the input/output pads to the device were located around the perimeter of the chip leaving most of the chip circuitry exposed even when probe cards were used to electrically stimulate the chip circuitry.

As additional levels of wiring were added to integrated circuit designs, the former technique of etching holes to the underlying circuit nodes lost its effectiveness due to poor aspect ratios of the etched holes. FIB approaches offered the high aspect ratio feature needed and are currently widely used to access circuit nodes. Additionally, many circuit designers have brought key circuit nodes up to test points at the upper levels of wiring in their initial hardware designs to facilitate the electrical access to these nodes.

FIB techniques are also widely used today for circuit modifications for engineering changes which are incorporated herein by reference to the article entitled "Design Guidelines for FIB Modifiability and a Case Study of High Performance SCSI Chip with Timing Problems" by S. X. Li et al, published in the Proceedings of the 20th International Symposium for Testing and Failure Analysis, Nov. 13–18, 1994. However, this approach is limited to placement of spare metal lines. FIB deposited lines contain a very high impurity concentration (e.g., carbon) and for typical line widths, lengths exceeding 50 microns may pose a problem due to high resistance (typically around 500 milliohms per square). Long FIB deposited lines also require a lengthy deposition time. A current practice to address this problem is to use an LCVD metal deposition technique to deposit the bulk of the line segment along with shorter elements of FIB deposited lines to complete the net. Additionally, semiconductor manufacturers are designing in spare wires at the upper levels of metal for the potential future use for circuit modifications.

The various approaches used in the past have a number of disadvantages; namely:

1. Wires must be placed (manually or through some sort of automated "fill" tool) during the design layout phase;
2. If left floating, the spare wires are susceptible to electrostatic charging problems;
3. Random placement of the spare wires makes it difficult for an analyst to locate them, especially if a stud via technology is used eliminating any features that would distinguish the spare wires from functional wires; and,
4. Such wires have no function unless used for a circuit change.
5. No facility is offered for external electrical access through chip pads to internal circuit nodes, for characterization and diagnostics purposes.

An example of prior art module wiring schemes which allow some degree of repairs and engineering changes to be made is described in U.S. Pat. No. 4,489,364 to Chance et al which shows an electronic circuit module in which connections to pads to which chips are connected are buried within the body of the multi-layer structure but are periodically brought to the surface of the module and linked by EC pads of a so-called "dog-bone" shape. Continuity of these connections may be broken by severing the narrow portion of the dog-bone and EC connections may be made thereto either with or without severing the original connection. However, if a defect occurs in or between the C4 pad and the first EC pad, no repair is possible and the module must be discarded. The wiring through via holes is particularly vulnerable to the occurrence of discontinuities, as well, which may or may not be repairable and, in any event, repair would require point-to-point wiring over a considerable distance, further increasing parasitic impedance of the overall wiring system. It can also be readily appreciated that the length of wiring involved in this scheme, including the repeated vertical traversals of the multi-layer structure through vias, is large and has a large lumped capacitance.

Additionally, U.S. Pat. No. 4,746,815 to Bhatia et al provides a switching circuit within the module to allow sharing of EC pads between received and driver circuits. U.S. Pat. No. 4,453,176 to Chance et al shows wiring to capacitances buried within the multi-layer structure. U.S. Pat. No. 4,840,924 to Kinbara shows a particular structure for the dog-bone EC pads. U.S. Pat. No. 4,254,445 to Ho shows a staggered chip location arrangement for a large number of chips in a module to minimize potential wiring crossovers and maximize the number of EC pads which can be provided. U.S. Pat. No. 4,549,200 to Ecker et al shows a repairable multi-level overlay system using redistribution. U.S. Pat. No. 4,546,413 to Feinberg et al shows a module structure in which EC pads are provided on both major surfaces of the multi-layer structure. U.S. Pat. No. 4,706,165 to Takenaka et al shows a multi-layer structure in which connections to module connection pins are made through vias to EC pads at the upper surface of the module to increase the types of engineering changes and repairs which can be made. U.S. Pat. No. 5,155,577 to Chance et al shows a connection matrix between terminals of IC carrier and EC pads. U.S. Pat. No. 5,243,140 to Bhatia et al shows a wiring system on the top surface of a multiple chip module which includes a redistribution layer. U.S. Pat. No. 5,508,938 to Wheeler shows special interconnect layer employing offset trace layout for advanced multi-chip module packages using conventional EC approach. U.S. Pat. No. 5,214,250 to Cayson et al shows a method of reworking circuit panels which can overlay encapsulated replacement lines one on top of another.

SUMMARY OF THE INVENTION

It is an object of the present invention to provide a system for engineering changes (EC), that is, to facilitate the following: electrical characterization; diagnostic testing; and circuit modifications for repair or evaluation.

It is another object of the present invention to provide a wiring distribution to characterize, diagnose or change IC functionality using multipurpose conductive stripes which may be incorporated into the IC design.

It is a further object of the present invention to provide the ability to route EC wires or stripes around chip surfaces or crossing other EC wires or stripes.

It is another further object of the present invention to provide access to a characterization node at a location not obstructed by I/O interconnect circuitry, packaging, or probe apparatus used to interface with the IC chip.

In order to satisfy the above and other objects of the present invention, a novel structure is provided for wiring layouts of an IC chip that includes conductive stripes that can be directed at a later time to link up with internal circuit nodes. The conductive stripes serve a functional utility in the as-designed device yet also allow the IC chip operation to be retained even after they are redirected for engineering changes. Optionally provided are pads and test points that can be directed to desired circuit nodes using the aforementioned EC wires, and interrogated or stimulated using standard test interfaces and programs.

In accordance with another aspect of the invention, a method for electrical characterization, failure analysis or for circuit modifications, is provided by allowing access to internal IC chip nodes.

BRIEF DESCRIPTION OF THE DRAWINGS

Other features and advantages of the invention will become apparent from the following description when taken in conjunction with the accompanying drawings in which.

DETAILED DESCRIPTION OF A PREFERRED EMBODIMENT

Figure 1:
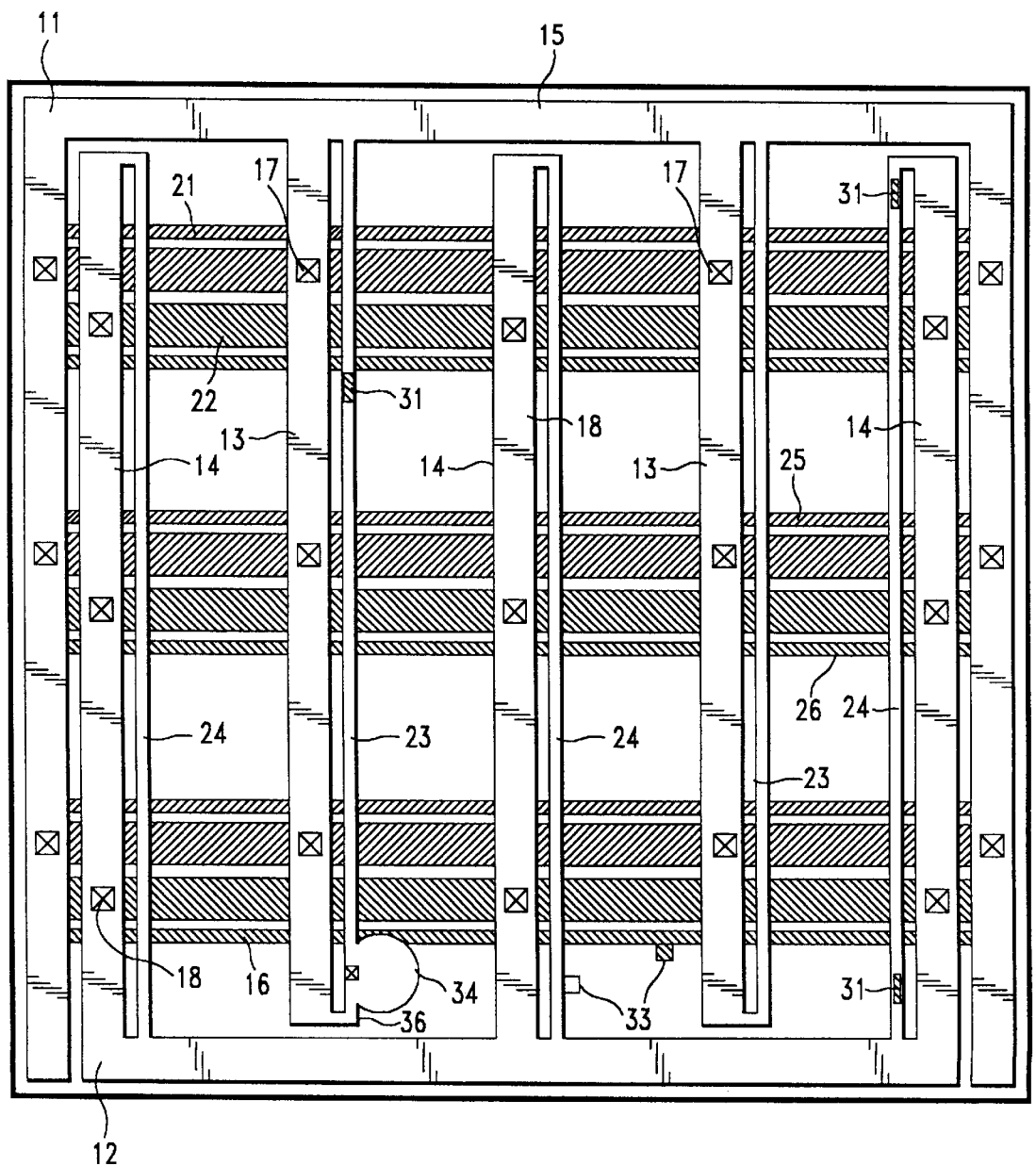
FIG. 1 is plan view of the present invention showing a first and second level of wiring.
Figure 2:
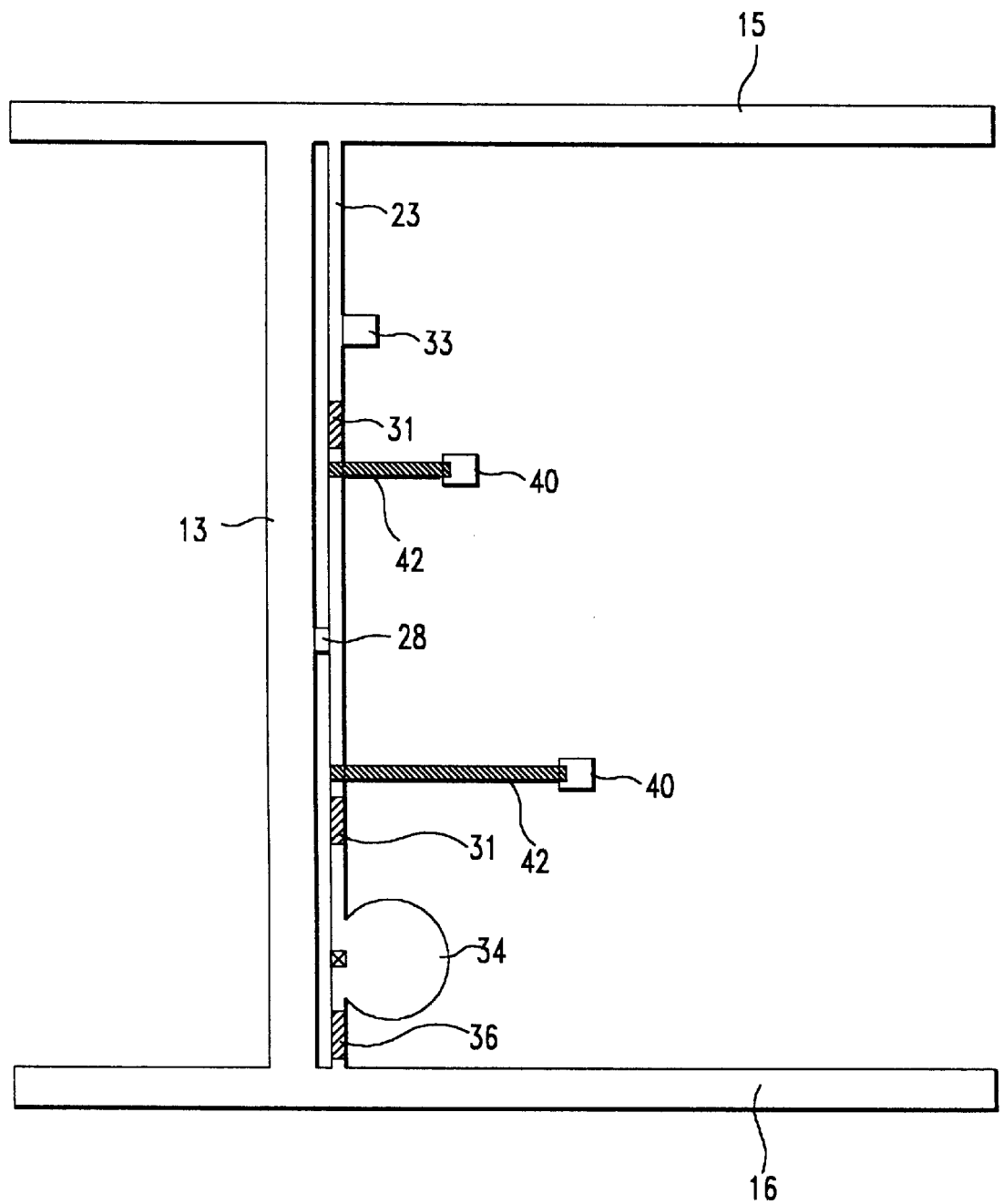
FIG. 2 is another plan view of the invention showing details of FIG. 1 wiring.

Referring now to the drawings, and more particularly to FIG. 1, a plan view of a portion of a wiring or interconnect layer in an integrated circuit is shown. This layer may be included at any level above the substrate on which semiconductor devices or elements are constructed. Preferably, the conducting or interconnect level of this invention would be applied near the uppermost level(s) of the integrated circuit for ease of access from the outside of the chip. Further, these levels may also be used for distribution of power or signals to the semiconductor elements or device as will be more fully explained hereinafter.

Figure 4A:
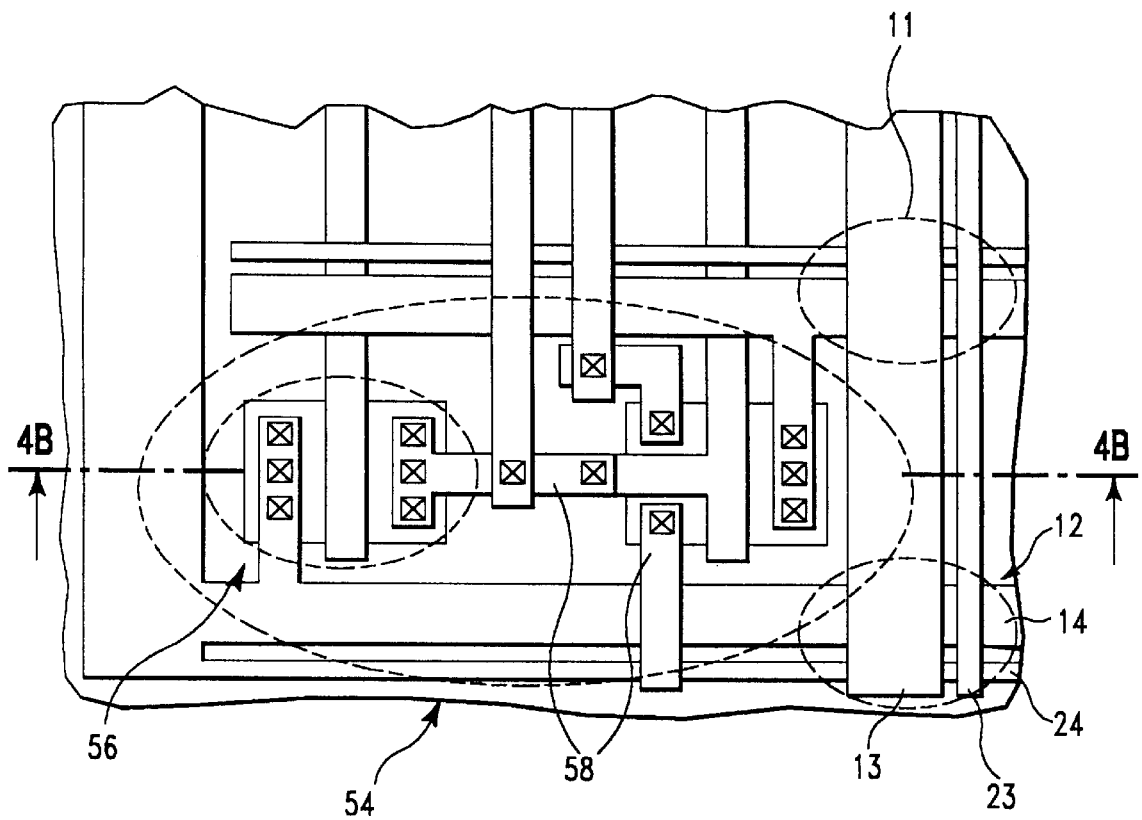
FIG. 4A is a plan view and FIG. 4B is a corresponding cross-sectional view showing further details of the integrated circuit of FIG. 1.
Figure 4B:
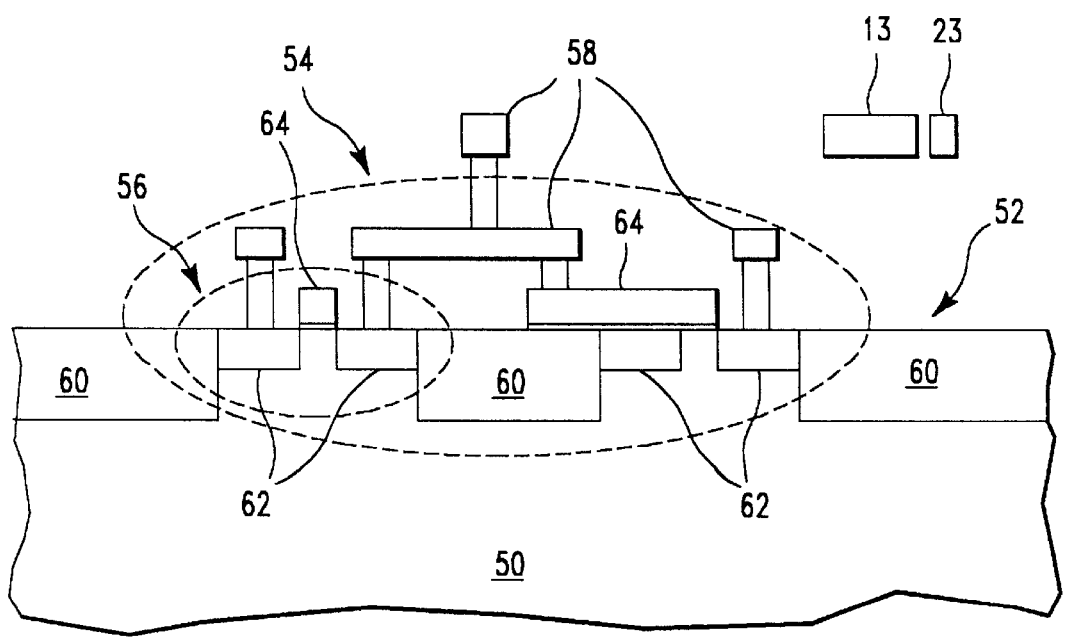

It is well known in the semiconductor field that wiring layers may be constructed in various wiring patterns of electrically conductive material such as copper or aluminum formed therein and thereon to connect or to provide power to various devices embedded in or mounted on the semiconductor substrate. FIG. 1 shows a portion of the two uppermost wiring distribution grid or networks 11 and 12, which could be at two different points or voltage levels ($V_{dd}$ and ground), major surface 52 of the semiconductor substrate 50 as shown in FIG. 4B. Each grid includes parallel rails 13 and 14 which are connected to and extend from a peripheral base conductor 15 and 16. Another layer of wiring distribution grids includes rails 21 and 22 is shown in relief on a second level or layer immediately below the uppermost layer. The rails 21 and 22 are analogous to the rails 13 and 14. As shown in FIG. 4A and FIG. 4B, be evident that additional layers below these two layers may also be included in the semiconductor integrated circuits 54. FIG. 4A shows a more detailed plan view of a portion of the dual layer distribution wiring system 11 and 12, and the corresponding integrated circuit 54. FIG. 4B is a cross-section of the integrated circuit 54 and wiring system 11 and 12 shown in FIG. 4A. FIG. 4B shows the integrated circuit 54 consisting of a semiconductor device 56 formed in a major surface 52 of the semiconductor substrate 50, interconnecting wiring layers 58, isolation regions 60, diffusion regions 62, and conductors 64. The two layers shown in FIG. 1 may be electrically interconnected using vias or other conductive paths at points 17 and 18. With this understanding, our discussion will now focus on the uppermost wiring distribution grid which may be used to conduct and distribute power or signals to the semiconductor circuits 54 in a conventional manner on the substrate 50 below.

Referring now to FIGS. 1, 2, 3, 4A and 4B narrow stripes 23 and 24 are positioned parallel to and spaced from the rails 13 and 14. The spacing between the stripes and rails will depend on a number of factors including the process used to create the semiconductor devices 56 and the voltages or signal carried by the wiring and parasitic constraints. For voltage or power distribution purposes the stripes are also connected to the base conductor 15 and 16. For signal or power distribution purposes, they may also be connected to the rails 13 and 14 and optionally by shunts 28. The stripes 23 and 24 are constructed such that they may be separated from the rails or the base conductor by breaking away a small portion or portions 31 of the stripe at appropriate locations along the stripe 23 or other areas such as immediately adjacent to the base conductor and removal of the optional shunts 28. It should be understood that other geometric wiring arrangements may be employed as long as the stripes and/or rails are kept electrically in parallel.

Figure 3:
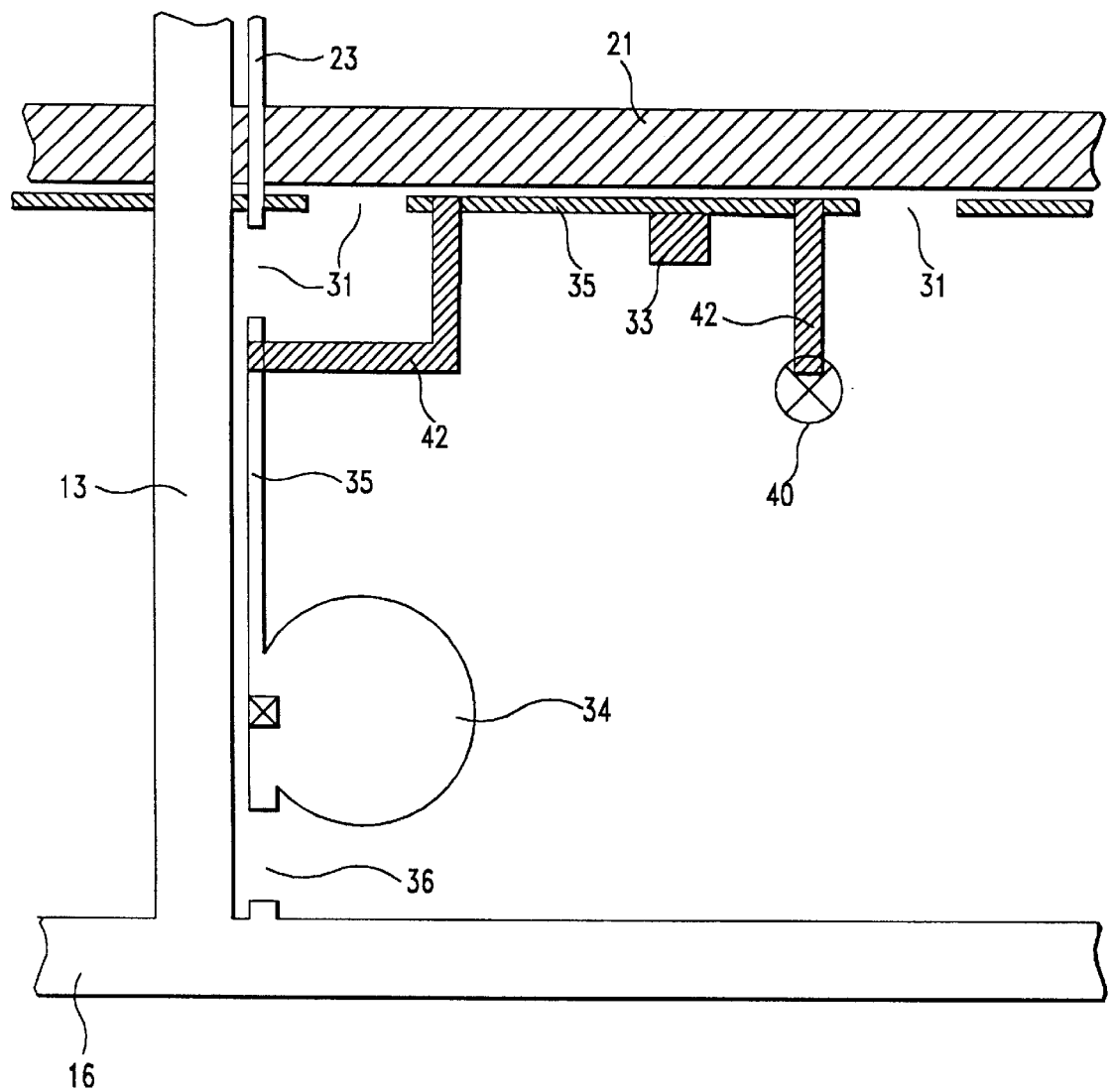
FIG. 3 is another plan view of the invention showing further details of FIG. 1 and FIG. 2 wiring.

In FIG. 1, additional test points 33 may also be attached to the narrow stripes 23 and 24 in order to provide ease of access for testing selected semiconductor elements (-transistors, resistors, capacitors, diodes, etc.). In similar fashion, narrow stripes 25 and 26 may be included in lower layers of wiring, analogous to stripes 23 and 24 on the upper layers of wiring. If wider or more robust connections are required, a pad 34 may be associated and electrically connected to the stripe 23. Stripe 23 may then be severed in areas 36 and 31 to separate the rail leaving the stripe attached to pad 34 as shown in FIG. 3. Accordingly, these pads, and isolated stripes, or test points, may be later strapped into the internal circuit using FIB or laser CVD.

Conventional techniques such as FIB or LCVD may now be used to connect these isolated stripes 35 optionally containing pads 34 or test points 33 to internal circuit nodes as shown in FIG. 3. Internal circuit nodes may be accessed by a deposited connection 42 to an existing probe point 40 or by using conventional FIB techniques to access buried nodes at 40. Another embodiment would be to use electrically alterable lines at the points where the stripes 23 and 24 join the rails 15 and 16. The electrically alterable links might be fuse elements, or switches controlled by SRAM, or even latches in a scan chain.

It is contemplated that the wiring patterns described may be used in conjunction with any other conventional etching, milling, and line deposition techniques including focused-ion-beam (FIB) approaches or LCVD. These conventional techniques are used with the aforementioned stripe segments, test points, and pads to effect access to internal circuit nodes. In fact, combinations of conventional techniques may be used such as:

Milling or etching a hole to a circuit net of interest in order to gain access to the node. Similarly, various Stripes 23 and 24 may be accessed;

Severing an internal circuit net in order to establish two circuit nodes. In a similar manner, the stripes 23 and 24 and any shunts 28 may be isolated from the rails 13 and 14 or base conductors 15 and 16; or Depositing a wire to a circuit node or stripe segment that traverses up through the milled opening and along the surface of the IC to some other location on the chip.

Using the foregoing techniques with any combination of stripe segments from any number of levels from which the stripes are available may be used to establish a new wire across a wide expanse of the chip.

Anyone skilled in the art with conventional FIB practices can appreciate the various techniques for milling and deposition of conductors and dielectrics to accomplish the operations described above.

Many other methodologies are also available to perform the engineering changes in IC's using the conventional techniques described above in conjunction with the present invention. These changes may include establishing access to an internal circuit node through a test point or chip pad for electrical characterization purposes, making circuit diagnostic tests, or modifications and repairs. This methodology has several advantages over previous methods that did not have the circuit wiring of the present invention such as:

Long low resistance stripes are available for long excursions across the chip offering the best conductive characteristics at minimal size which would reduce the analyst's tool set since any need for depositing low resistance lines such as with LCVD deposition tools is reduced or eliminated.

Engineering change wires may now cross over each other using stripes on differing planes while formerly dielectric insulators were needed at such intersections of engineering change wires placed on the IC surface.

Obstacles on the chip surface such as pads and fuse block openings may be more readily averted using the embedded stripes.

The wiring may be used to re-direct existing pads for characterization or engineering changes requiring access through conventional pad probers or through the IC module packaging.

The wiring may be used to strategically place test points that can be linked to any internal circuit net on the chip. This might be used to provide test point access that is not obstructed by probe apparatus used to interface with the pads of the chip.

The wiring minimizes the chip area needed for designed-in wire structures and in the preferred embodiment, offers a ready means for the analyst to identify the stripes since they are a derivative of the power distribution network.

The derivation of spare wires from a power distribution network is particularly advantageous for application specific IC because the network is often fixed for most parts using any given master image. Therefore, the design overhead, although minimal, is spread over all parts fabricated in that master image. Memory parts might take advantage of power, data, or work select lines (depending upon the layout approach) that already traverse significant expanses of the cell arrays. The custom and semi-custom environments in which microprocessors, controllers, and specials are fabricated in may utilize a combination of power and signal distributions to derive the re-routable stripes. Since any parallel stripe scheme adds capacitance, it is far more desirable to target power rails over signal lines.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

What is claimed is:

1. An integrated circuit with a plurality of interconnecting wiring layers comprising:
   (a) a number of semiconductor devices in a major surface of a semiconductor substrate;
   (b) said plurality of interconnecting wiring layers connecting said number of semiconductor devices in said major surface of said semiconductor substrate; and
   (c) a dual layer distribution wiring system in the uppermost wiring layers of said integrated circuit, each layer of said dual layer distribution wiring system on a level above said semiconductor devices and co-planar with said major surface of said semiconductor substrate and arranged orthogonal to one another for making electrical connections to said number of semiconductor devices, each layer of said dual layer distribution wiring system comprising:
   a conducting rail which is connected orthogonally to a peripheral base conductor which provides power to said semiconductor devices through said plurality of interconnecting wiring layers
   a redundant and separable conducting stripe connected to said conducting rail and said base conductor to be electrically parallel to said conducting rail, said redundant conducting stripe conducting power to said semiconductor devices while connected to said conducting rail and said base conductor and when separated from said conducting rail and said base conductor said conducting stripe being electrically isolated from said conducting rail and from said semiconductor devices wherein said redundant and separable conducting stripe becomes an isolated conducting stripe which is used to provide connections to a pre-selected portion of said plurality of interconnected wiring layers whereby engineering changes are accomplished.

2. A semiconductor device as recited in claim 1 wherein said conducting stripe is electrically connected to said conducting rail by removable shunts attached to and between said conducting rail and said conducting stripe.

3. A semiconductor device as recited in claim 1 which includes test points attached to said conducting stripe which are used to facilitate electrical access to said microscopic wiring connections.

4. A semiconductor device as recited in claim 1 which includes pads attached to said conducting stripes which are used to facilitate electrical access to the microscopic wiring connections to be rewired.

5. A semiconductor device as recited in claim 1 which includes electrically isolated alterable links to interconnect said conducting rail to said conducting stripe.

6. The integrated circuit as recited in claim 1, wherein said plurality of interconnecting wiring layers are between said major surface of said semiconductor substrate and the lowermost wiring layer of said dual layer distribution wiring system.

7. An integrated circuit with a plurality of interconnecting wiring layers, comprising:

(a) a number of semiconductor devices in a major surface of a semiconductor substrate;

(b) said plurality of interconnecting wiring layers connecting and said number of semiconductor devices in said major surface of said semiconductor substrate; and (c) a dual layer distribution wiring system in the uppermost wiring layers of said integrated circuit, each layer of said dual layer distribution wiring system on a level above said semiconductor devices and co-planar with said major surface of said semiconductor substrate and arranged orthogonal to one another for making electrical connections to said number of semiconductor devices, each layer of said dual layer distribution wiring system comprising:

a conducting rail which carries signals and interconnects with said plurality of interconnecting wiring layers; and a redundant conducting stripe which is electrically parallel to said rail and when separated from said rail is electrically isolated from said rail and from said semiconductor devices to become an isolated conducting stripe wherein said isolated conducting stripe is electrically connected to certain pre-selected plurality of interconnecting wiring layers whereby engineering changes are accomplished.

8. A method of performing engineering changes to an integrated circuit having a plurality of interconnecting wiring layers connecting a number of semiconductor devices in a major surface of a semiconductor substrate comprising the steps of:

providing electrically parallel redundant conducting stripes having test pads or test points which are initially electrically connected in parallel to a plurality of electrically conducting rails;

severing said conducting stripes from said conducting rails to isolate the stripes from the said conducting rails;

connecting the severed conducting stripe to a pre-selected portion of said plurality of interconnecting wiring layers; and making engineering changes to said integrated circuit.

* * * * *